(12) United States Patent
Vanhoucke et al.

(10) Patent No.: US 9,570,546 B2
(45) Date of Patent: Feb. 14, 2017

(54) BIPOLAR TRANSISTOR

(71) Applicant: NXP B.V., Eindhoven (NL)

(72) Inventors: Tony Vanhoucke, Leuven (BE); Viet Thanh Dinh, Leuven (BE); Petrus Hubertus Cornelis Magnee, Nijmegen (NL); Ponky Ivo, Leuven (NL); Dirk Klaassen, Eindhoven (NL); Mahmoud Shehab Mohammad Al-Sa'di, Nijmegen (NL)

(73) Assignee: NXP B.V., Eindhoven (NL)

( * ) Notice: Subject to any disclaimer, the term of this patent is extended or adjusted under 35 U.S.C. 154(b) by 12 days.

(21) Appl. No.: 14/852,385

(22) Filed: Sep. 11, 2015

(65) Prior Publication Data

US 2016/0079345 A1   Mar. 17, 2016

(30) Foreign Application Priority Data

Sep. 12, 2014  (EP) .................... 14184549

(51) Int. Cl.
| | |
|---|---|
| *H01L 29/06* | (2006.01) |
| *H01L 29/66* | (2006.01) |
| *H03F 3/21* | (2006.01) |
| *H01L 29/417* | (2006.01) |
| *H01L 21/324* | (2006.01) |

(Continued)

(52) U.S. Cl.
CPC .......... *H01L 29/063* (2013.01); *H01L 21/324* (2013.01); *H01L 29/0649* (2013.01); *H01L 29/0821* (2013.01); *H01L 29/36* (2013.01); *H01L 29/41708* (2013.01); *H01L 29/6625* (2013.01); *H01L 29/66242* (2013.01);

(Continued)

(58) Field of Classification Search
CPC ............................. H01L 29/063; H01L 21/324
See application file for complete search history.

(56) References Cited

U.S. PATENT DOCUMENTS

| | | |
|---|---|---|
| 5,216,275 A | 6/1993 | Chen |
| 2005/0110097 A1 | 5/2005 | Chen |

(Continued)

FOREIGN PATENT DOCUMENTS

WO   WO-2011004670 A1   1/2011

OTHER PUBLICATIONS

Slotboom, Jan Willem; "Analysis of Bipolar Transistors"; Thesis Delft University; 142 pages. (Oct. 25, 1977).

(Continued)

*Primary Examiner* — Su C Kim
*Assistant Examiner* — David S Wilbert

(57) ABSTRACT

A semiconductor device comprising a bipolar transistor and a method of making the same. A power amplifier including a bipolar transistor. The bipolar transistor includes a collector including a laterally extending drift region. The also includes a base located above the collector. The bipolar transistor further includes an emitter located above the base. The bipolar transistor also includes a doped region having a conductivity type that is different to that of the collector. The doped region extends laterally beneath the collector to form a junction at a region of contact between the doped region and the collector. The doped region has a non-uniform lateral doping profile. A doping level of the doped region is highest in a part of the doped region closest to a collector-base junction of the bipolar transistor.

14 Claims, 6 Drawing Sheets

(51) Int. Cl.
  H01L 29/735 (2006.01)
  H01L 29/08 (2006.01)
  H01L 29/36 (2006.01)
  H01L 29/737 (2006.01)

(52) U.S. Cl.
  CPC ........ *H01L 29/735* (2013.01); *H01L 29/7378* (2013.01); *H03F 3/21* (2013.01)

(56) References Cited

U.S. PATENT DOCUMENTS

| | | | |
|---|---|---|---|
| 2008/0017895 A1 | 1/2008 | Fallica et al. | |
| 2010/0159664 A1* | 6/2010 | Gluschenkov | H01L 29/0821 438/312 |
| 2013/0069154 A1* | 3/2013 | Tsuchiko | H01L 21/8222 257/335 |
| 2013/0140604 A1 | 6/2013 | Hu et al. | |
| 2014/0061858 A1* | 3/2014 | Lin | H01L 29/73 257/565 |

OTHER PUBLICATIONS

Extended European Search Report for application 14184549.5 (Mar. 2, 2015).

Fregonese, S. et al; "A compact model for SiGe HBT on thin-film SOI"; IEEE Transactions on Electron Devices, vol. 52, Issue 2; pp. 296-303 (2006).

Geynet, B. et al; "High-Voltage HBTs Compatible with High-Speed SiGe BiCMOS Technology"; IEEE Topical Meeting on Silicon Monolithic Integrated Circuits in RF Systems, SiRF 2008), IEEE Conference Publications; pp. 210-213 (2008).

Greenberg, D.R. et al; "Large-signal performance of high-BV/sub CEO graded epi-base SiGe HBTs at wireless frequencies"; International Electron Devices Meeting, Technical Digest; pp. 799-802 (1997).

Melaib, J. et al; "A new sub-micron 24 V SiGe:C resurf HBT"; Proceedings of the 16th International Symposium on Power Semiconductor Devices and ICs, IEEE Conference Publications; pp. 33-36 (2004).

Mertens, H. et al; "Extended high voltage HBTs in a high-performance BiCMOS process"; IEEE Bipolar/BiCMOS Circuits and Technology Meeting; pp. 158-161 (2011).

Preisler, E.J. et al; "Integration of a 5.5V BV CEO SiGe HBT within a 200 GHz SiGe BiCMOS process flow"; IEEE Conference Publications, Bipolar/BiCMOS Circuits and Technology Meeting; pp. 202-205 (2007).

Slotboom, Jan Willem; "Analysis of Bipolar Transistors"; Thesis Delft University; 142 pages (Oct. 25, 1977).

Sorge, R. et al; "Concept of vertical bipolar transistor with lateral drift region, applied to high voltage SiGe HBT"; IEEE 12 Topical Meeting on Silicon Monolithic Integrated Circuits in RF Systems (SiRF); pp. 223-226 (2012).

Sorge, R. et al; "Integration of a 50 V BVCEO SiGe:C HBT into a 0.25 um SIGE:C bicMOS Platform"; IEEE 14th Topical Meeting on Silicon Monolithic Integrated Circuits in RF Systems (SiRF); pp. 89-91 (2014).

* cited by examiner

BIPOLAR TRANSISTOR

CROSS-REFERENCE TO RELATED APPLICATIONS

This application claims the priority under 35 U.S.C. §119 of European patent application no. 14184549.5, filed on Sep. 12, 2014, the contents of which are incorporated by reference herein.

FIELD OF THE INVENTION

This invention relates to a bipolar transistor, a method of making a bipolar transistor and a power amplifier including a bipolar transistor.

BACKGROUND OF THE INVENTION

RF power amplifiers are key components in any high-frequency system and application. The demand for higher bandwidth and higher speeds for multimedia applications puts stringent requirements on these amplifiers such as high output power, linearity and efficiency. Amplifiers comprising bipolar transistors (such as heterojunction bipolar transistors (HBTs) are often used in preference to CMOS-based devices for RF power amplifiers because of their excellent performance at high frequencies.

A limitation of silicon based devices (e.g. SiGe HBTs) is that the smaller bandgap of silicon compared to some III-V materials typically gives rise to a lower breakdown voltage (BV), which can inhibit the operation of such devices at high voltages.

Efforts have been made to create higher-breakdown SiGe HBTs by optimization of collector profiles (trading off the breakdown voltage (BV) and cut-off frequency ($f_T$)). For example, see:

D. R. Greenberg et al. "Large-signal performance of high-BVCEO graded epi-base SiGe HBTs at wireless frequencies" IEDM Proceedings, pp. 32.3.1-32.3.4, 1997;

E. J. Preisler et al. "Integration of a 5.5V BVCEO SiGe HBT within a 200 GHz SiGe BiCMOS flow", BCTM Proceedings, pp. 202-205, 2007;

B. Geynet et al., "High-voltage HBTs compatible with high-speed SiGe BiCMOS technology", SiRF Proceedings, pp. 210-213, 2008; and H. Mertens et al. "Extended high voltage HBTs in high-performance BiCMOS process", BCTM Proceedings, 2011.

Other efforts have involved using reduced surface field (RESURF) effects (using either a field plate or pn junction) to improve performance in terms of $BV \times f_T$ (see, for example, J. Melai et al., "A new sub-micron 24 V SiGe:C RESURF HBT", ISPSD Conference, 2004).

R. Sorge et al., "Concept of vertical bipolar transistor with lateral drift region, applied to high voltage SiGe HBT", SiRF, 2012 describes a vertical bipolar transistors having an additional lateral drift region introduced between a sub collector and collector contact region. This is described as enabling the fabrication of high voltage bipolar transistors for RF power applications. The introduction of an additional lateral drift region with a length of 1.2 µm increased the open base breakdown voltage BVCEO of the HBT 7V to 18V. The same device concept has been again shown to be able to have a much larger BVCEO, up to 35V, in R. Sorge et al., "Integration of a 50 BVCEO SiGe:C HBT into a 0.25 µm SiGe:C BiCMOS platform", SiRF, 2014. However, one of the main bottlenecks of these devices is a high collector resistance. This can turn on the parasitic PNP of the device and cause a strong reduction in $f_T$.

A device having a lateral drift region, which does not suffer from an increase in collector resistance would be especially promising for power amplifier applications.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided a semiconductor device including a bipolar transistor. The bipolar transistor includes a collector including a laterally extending drift region. The bipolar transistor also includes a base located above the collector. The bipolar transistor further includes an emitter located above the base. The bipolar transistor also includes a doped region having a conductivity type that is different to that of the collector. The doped region extends laterally beneath the collector to form a junction at a region of contact between the doped region and the collector. The doped region has a non-uniform lateral doping profile. A doping level of the doped region is highest in a part of the doped region closest to a collector-base junction of the bipolar transistor.

According to another aspect of the invention, there is provided a method of manufacturing semiconductor device comprising a bipolar transistor. The method includes forming a collector including a laterally extending drift region. The method also includes forming a base located above the collector. The method further includes forming an emitter located above the base. The method also includes foaming a doped region having a conductivity type that is different to that of the collector. The doped region extends laterally beneath the collector to form a junction at a region of contact between the doped region and the collector. The doped region has a non-uniform lateral doping profile. A doping level of the doped region is highest in a part of the doped region closest to a collector-base junction of the bipolar transistor.

The placement of the doped region extending laterally beneath the collector may allow for electrical-field shaping within the collector to improve the breakdown voltage within the device. The doped region has a non-uniform lateral doping profile. The non-uniform doping profile may allow the field shaping within the collector to be tailored to the layout and doping profile of the device, for instance to the configuration and layout of the collector. The doping level is highest close to the collector-base junction. In this way, relatively strong field shaping can take place close to the collector-base junction, where the field is generally highest and critical to breakdown voltages, without adversely affecting other parts of the device (e.g. by reducing the breakdown voltage at or near a collector contact of the device and/or increasing the collector resistance $R_C$ as described in more detail herein below).

The junction at the region of contact between the doped region and the collector may be a p-n junction in which the collector is either n-type or p-type and in which the doped region is either p-type or n-type, respectively.

The doped region may be formed using ion implantation. For instance, during manufacture, a first implantation step may be used to form a portion of the doped region having a first doping level, and a second implantation step can be used to form a portion of the doped region closest to a collector-base junction having a second doping level, where the second doping level is higher than the first doping level. The implantation steps may be followed by an annealing step, to activate the dopants.

In one embodiment, the part of the doped region closest to the collector-base junction may be located vertically beneath the collector-base junction.

The vertical dimension of the doped region may be at its greatest in the part of the doped region closest to the collector-base junction and having the highest doping level. In this way, the doped region may extend toward the collector-base junction, enhancing the strength of the field shaping in a manner that need not affect the strength of the field shaping applied in other regions of the collector (e.g. distal the collector-base junction, at the collector contact). In one embodiment, the part of the doped region closest to the collector-base junction is a part of the doped region that is outdiffused to a greater extent than a remainder of the doped region. The outdiffusion of the doped region closest to the collector-base junction may take place during the anneal step noted above, for activating the dopants.

An isolation region may be located above the laterally extending drift region of the collector. This isolation region may allow other features of the device, such as a base polysilicon layer and base contact(s) to be located vertically above the collector. The isolation region may be formed from a dielectric such as Silicon oxide and/or silicon nitride.

One or more openings may be formed in the isolation region to allow access to the underlying collector. In one embodiment, the collector-base junction may be located at an opening in the isolation region. The vertical dimension of the collector may be at its greatest in a part of the collector closest to the opening, e.g. as the collector extends vertically through the opening to make contact with the base to faun the collector-base junction.

The device may further include a collector contact for making electrical contact with an end of the laterally extending drift region of the collector that is distal the collector-base junction. A sinker may extend downwardly from the collector contact into the collector, to complete the connection. In such examples, the collector extends laterally between the sinker and collector-base junction. The sinker may pass through an opening in the isolation region as noted above.

In one example, the sinker may extend laterally beneath the isolation region in a direction towards the collector-base junction. This lateral extension of the sinker in a direction towards the collector-base junction may reduce an effective drift length of the collector, e.g. by reducing the effective lateral dimension of the drift region. The lateral extension of the sinker may be formed using an ion implantation step, for example using a dedicated mask, to implant through the overlying isolation region. The lateral extension of the sinker may allow the effective drift length of the collector to be adjusted (e.g. can be made sufficiently short) without impeding the layout of other parts of the device or requiring a change in device layout. For instance, one of more base contacts may be located vertically above the laterally extending drift region of the collector. The lateral extension of the sinker can shorten the effective drift length of the collector while still leaving space for such base contact(s).

In some embodiments, a further doped region can be located beneath the doped region, the further doped region having the same conductivity type as the doped region. The further doped region may have a lower doping level than any part of the doped region. A potential may be applied to the doped region through the further doped region. The device may also include a contact for applying a potential to the doped region, for shaping the field within the collector drift region. The contact may be a substrate contact of the device.

The bipolar transistor may be an npn bipolar transistor in which the conductivity type of the collector and the emitter is n-type and the conductivity type of the base is p-type. It is also envisaged that the bipolar transistor may be an pnp bipolar transistor in which the conductivity type of the collector and the emitter is p-type and the conductivity type of the base is n-type.

According to a further aspect of the invention, there is provided a power amplifier including a semiconductor device of the kind described above.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Embodiments of this invention can provide an improved semiconductor device comprising a bipolar transistor. The bipolar transistor may be a vertical device in the sense that the base and emitter may be located above the collector on a semiconductor substrate. The collector includes a laterally extending drift region. Typically, the collector-base junction may be located at or near a first end of the laterally extending region of the collector. In some examples, the collector may have two laterally extending drift regions each extending away from a centrally located collector base junction. In some embodiments, the device may be provided in the form of a ring in which the laterally extending drift region extends away from a centrally located collector base junction.

One or more contact(s) of the collector may be provided at a second end of the (or each) lateral draft region of the collector, distal the collector-base junction. In order to permit field shaping within the collector, a doped region is provided that has a conductivity type that is different to that of the collector. For example, where the collector is n-type, the doped region is p-type, or where the collector is p-type, the doped region is n-type. The doped region extends laterally beneath the collector and is in contact with the collector so that a p-n junction is formed at the region of contact between the doped region and the collector. In use, a potential may be applied to the doped region for modifying the electric field within the collector as described in more detail below.

The doped region itself has a non-uniform lateral doping profile. Thus, the doping level within the doped region varies along the length of the doped region. As described herein, this variation in the doping level within the doped region can be used to tailor the strength of the field shaping within the collector and can also be used to tailor the spatial extent of the doped region itself (for example, by greater outdiffusion of more highly doped parts of the doped region). A doping level of the doped region is highest in a part of the doped region that is closest to the collector-base junction of the bipolar transistor. As will be explained in more detail below, it is desirable that this part of the doped region be more highly doped than, for example, parts of the doped region corresponding to the lateral drift region of the collector and/or the location of the collector contact.

Figure 1:
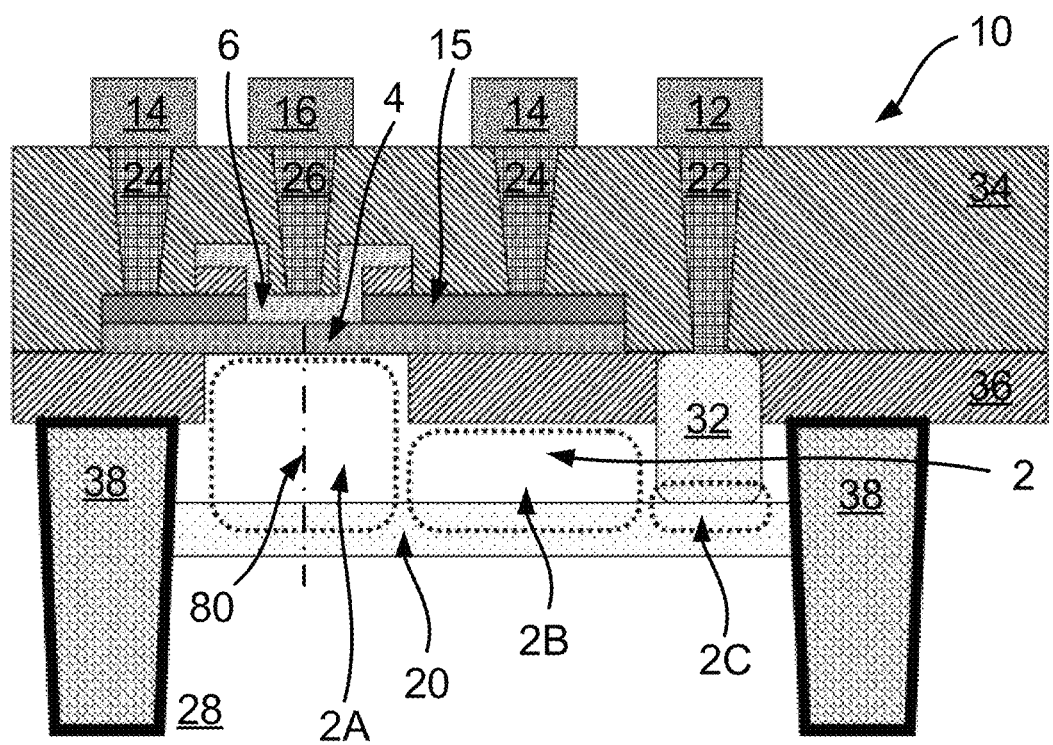
FIG. 1 shows an example of a bipolar transistor having a collector including a laterally extending drift region.

A semiconductor device 10 comprising a bipolar transistor is shown in FIG. 1. The device 10 is provided on a semiconductor substrate. The device includes a collector 2 which is bounded by isolation regions 38 (e.g. deep-trench isolation, DTI) for electrically isolating the transistor from other parts of the substrate. The isolation regions 38 may for example, comprise trenches filled with a dielectric such as silicon oxide. In some embodiments, the trenches may be filled with a combination of dielectric plus one or more other material(s) (e.g. polysilicon, as is known in the art). The collector 2 may be formed by an epitaxial process and can, for example, comprise epitaxial silicon. The bipolar transistor also includes a base region 4 and an emitter region 6. The base 4 and emitter 6 may also be formed from epitaxially. For example, the base 4 may comprise epitaxial SiGe, while the emitter 6 may comprise epitaxial silicon.

The transistor shown in FIG. 1 is a vertical device in the sense that the base 4 and emitter 6 are both provided in a vertical stack above the collector 2. Notwithstanding this, the device has features that extend laterally in the substrate, such as the collector 2.

As shown in FIG. 1, collector contact(s) 22, base contact(s) 24 and emitter contact(s) 26 can be provided for connecting to the collector 2, base 4 and emitter 6, respectively. These contact(s) may be provided in the form of plugs passing through a dielectric layer 34 deposited over the surface of the substrate. The plugs may comprise an electrically conductive material such as Tungsten. Electrically conductive interconnects 12, 14, 16 may be provided to connect with the contact(s) 22, 24, 26, respectively. The interconnects 12, 14, 16, which may extend in one or metal layers of a metallisation stack of the device, can comprise a metal such as aluminium.

An isolation layer (e.g. shallow-trench isolation, STI) 36 is also provided. The isolation layer 36 includes an opening to allow the collector 2 to make contact with an underside of the base 4, thereby to form the collector-base junction. Another opening in the isolation region 36 allows a sinker 32 to extend downwardly beneath the collector contact 22 into the collector 2.

The bipolar transistor further includes a doped region 20. The doped region has a conductivity type which is different to the conductivity type of the collector 2. In the present example, the collector 2 is n-doped, whereas the doped region 20 is p-doped. The doping level of the doped region 20 is also generally higher than that of the collector 2 (for instance the collector 2 may be n⁻ doped, while the doped region 20 may be p⁺ doped).

The substrate beneath the doped region 20 is also doped. The conductivity type of the substrate is the same as that of the doped region 20, although the substrate is more lightly doped than the doped region 20. The substrate includes a region 28 delineated by the isolation regions 38.

By applying a potential to the doped region 20 (for example using a substrate contact that is in electrical communication with the doped region 20 through the region 28) the electric field within the collector 2 can be modified. The shaping of the field in the collector 2 can supress breakdown within the bipolar transistor. Compared to conventional devices, which do not include a region such as the doped region 20, for a given $V_{CE}$, the field in the collector drift region is reduced by the reduced surface field effect (RE-SURF) while the field at the substrate-collector junction increases. This redistribution of the field reduces impact ionisation within the device, which can dramatically increase the voltage at which the base current changes its sign (this corresponds to the breakdown voltage $BV_{CEO}$).

Figure 2:
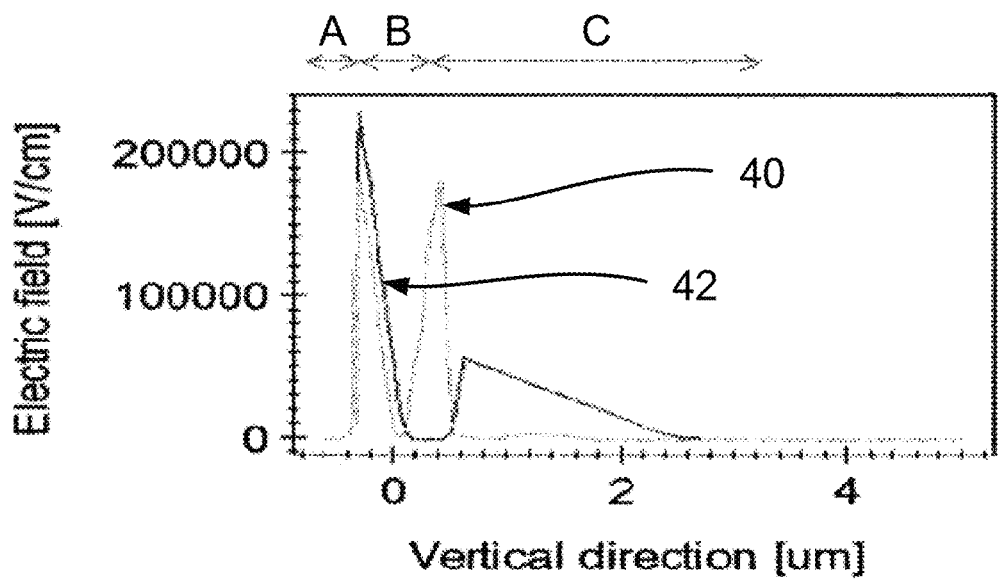
FIG. 2 compares the electric field within the bipolar transistor of FIG. 1 (along the line labelled 80 in FIG. 1) with a bipolar transistor in which no doped region is provided beneath the collector.

FIG. 2 plots the electric field within a device of the kind shown in FIG. 1 (see plot 40) and within a device similar to that shown in FIG. 1 with the exception that no doped region 20 is provided beneath the collector 2. The x-axis in the graph of FIG. 2 shows the spatial position within the device along the vertical dotted line 80 shown in FIG. 1. Various portions of the device located vertically beneath the emitter are denoted by the regions A, B and C indicated in FIG. 2. In particular, region A corresponds to the base region 4, region B corresponds to the collector 2 and the region C corresponds to the underlying region 28 of the substrate (including also the doped region 20, in the case of plot 40).

In FIG. 2, note that the total area beneath each plot is equal and corresponds to the voltage. Breakdown occurs in a device when a peak in the electric field exceeds the critical field ($E>E_c$). As can be seen in FIG. 2, where a doped region 20 is provided the peak in electric field at the collector-base junction is reduced, whereas the peak in the electric field at the collector-substrate junction is increased. Thus, the use of the doped region 20 can allow the electric field peak at the collector-base junction to be reduced, thereby inhibiting breakdown within the device. The plots in FIG. 2 were made with the assumption that $V_{BE}$=0.6V and $V_{CE}$=5V.

The bipolar transistor in the example of FIG. 1 has a collector 2 that includes three distinct regions 2A, 2B, 2C. The first region 2A is located beneath the collector-base junction. The second region 2B is a lateral drift region of the collector 2, which can be seen to be located beneath the isolation region 36 that separates the collector 2 from the extrinsic base connection 15. The third region 2C of the collector 2 is located in between the sinker 32 and the doped region 20. The doped region, which has a uniform doping profile, can allow shaping of the electric field within the collector 2. However, in accordance with embodiments of this invention, the device of FIG. 1 may be improved further.

Firstly, the vertical peak electric field in region 2A at the collector-base junction is generally located further away from the doped region 20 than is the electric field within the lateral drift region 2B of the collector 2 located beneath the isolation region. This is due to the vertical thickness of the isolation region 36 itself, noting that the collector-base junction is located at an upper end of the opening in the isolation region. It can therefore be seen that these two different regions may require different RESURF optimisation for best field shaping.

Moreover, for effective field shaping to reduce the peak electric field at the collector-base junction, it may generally be preferable to provide doped region 20 having a high doping level. On the other hand, when the doped region 20 is highly doped, this can increase the electric field between the sinker 32 and the doped region 20 so that the breakdown voltage of this junction may become lower than the transistor breakdown voltage. In such cases, the maximum voltage that can be handled by the transistor would become limited by a potential collector-substrate breakdown near the sinker 32, which would clearly be undesirable.

Furthermore, when the doped region 20 is highly doped, outdiffusion of the dopants of the doped region 20 into the lateral drift region 2B of the collector 2 during manufacture (typically during an annealing step) can dramatically increase collector resistance $R_C$. When the transistor is operated at high currents (for example, $V_{BE}$=700 mV) the internal base-collector voltage can become forward biased (while keeping it reverse biased externally) due to the voltage drop across the collector (associated with the increased $R_C$) induced by the collector current. Consequently, a parasitic PNP device (consisting of the internally forward biased base-collector junction and the reverse biased collector-substrate junction) can switch on and cause a dramatic increase of the substrate current and charge storage. This may lead to a low $f_T$ for the device.

Figure 3:
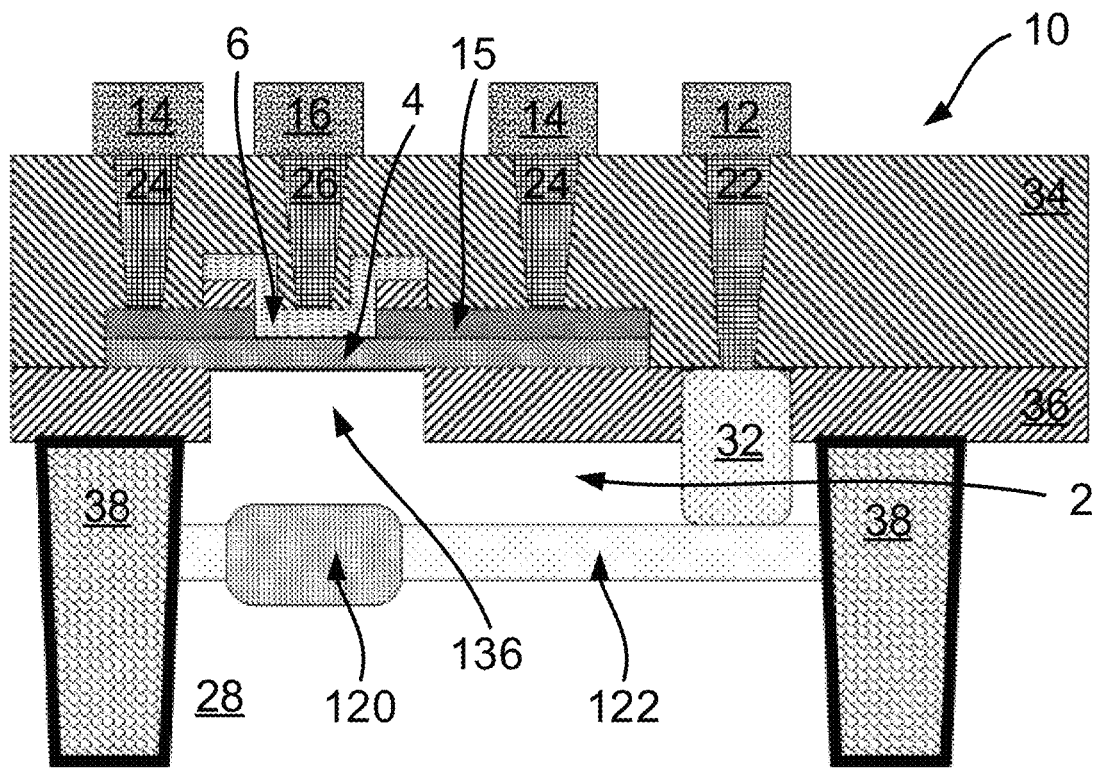
FIG. 3 shows a bipolar transistor in accordance with an embodiment of the invention.

FIG. 3 illustrates a semiconductor device 10 comprising a bipolar transistor according to an embodiment of the invention. The device is provided on a semiconductor (e.g. silicon) substrate. The bipolar transistor includes a collector 2 that has a laterally extending drift region, a base 4 that is located above the collector and an emitter 6 that is located above the base 4. The collector 2, base 4 and emitter 6 may be epitaxially grown (e.g. they may comprise epitaxially grown silicon). The device may, in some embodiments be a heterojunction bipolar transistor such as a SiGe:Si heterojunction bipolar transistor in which silicon doped with germanium in varying levels is used to form heterojunctions at the collector-base and the base emitter junctions.

The device 10 of FIG. 3 may also include one or more emitter contacts 26 of the kind noted above in respect of FIG. 1. The emitter contact(s) may connect to the emitter 6 through an oxide layer 34 of the device. Similarly, one or more base contacts 24 of the kind described above can be provided on either side of the base 4. The base contacts 14 can be connected to extrinsic base connection 15 (comprising e.g. polysilicon). In some embodiments, one or more collector contacts 22 may also make contact with the collector 2 A sinker 32 can be provided to complete the connection as will be described in more detail below. As described above, interconnects 12, 14, 16 may also be provided.

In this embodiment, the device 10 includes an isolation region 36. The isolation region 36 may be provided on a major surface of the substrate, above the collector 2. The isolation region 36 may have one or more openings to allow access to the underlying collector 2. One of these openings may allow the collector 2 to make contact with the base 4 as shown in FIG. 3. The collector 2 can extend upwardly through the opening in the isolation region 36 to form the collector-base junction. One or more further openings can allow the sinker 32 to complete the connection between the collector 2 and the collector contact(s) 22. In this embodiment, the collector base junction is provided at a first end of the lateral drift region of the collector 2, while the sinker 32 and collector contact(s) 22 are provided at a second, opposite end of the lateral drift region of the collector 2.

The device may include isolation regions 38 that serve to isolate the collector 2 and a local underlying region 28 of the substrate from other parts of the semiconductor substrate upon which the semiconductor device 10 is provided.

The semiconductor device includes a doped region. As shown in FIG. 3, the doped region extends laterally beneath the collector 2. The doped region has a conductivity type that is different to the conductivity type of the collector 2. In the present embodiment, the bipolar transistor is an npn transistor so that the collector 2 is n-type. Therefore, in the present embodiment, the doped region is p-type. In this embodiment, the doping level of the collector is in the range $1\times10^{16}$-$1\times10^{17}$ cm$^{-3}$. It is envisaged that in a pnp transistor, the doped region beneath the collector 2 may be n-type.

The doped region has a non-uniform lateral doping profile. Accordingly, with reference to the example in FIG. 3, the doping level within the doped region of the device varies along the lateral dimension of the doped region. As will be explained in more detail below, the non-uniform doping profile of the doped region may allow for further optimisation of the field shaping within the collector 2 to suppress breakdown within the device. In use, a potential can be applied to the doped region to shape the field in the collector 2. The potential may be applied using, for example, a substrate contact which is in electrical communication with the doped region via the underlying substrate region 28.

As shown in FIG. 3, the doped region includes two parts 120, 122 in this embodiment. The first part 120 is in a position closest to the collector-base junction of the transistor. The second part 122 of the doped region in this example is located beneath the laterally extending drift region of the collector 2 and the sinker 32. In this embodiment, the first part 120 of the doped region has a higher doping level than the second part 122 of the doped region. Thus, the overall lateral doping profile of the doped region is non-uniform. In this embodiment, the doping level of the first part 120 is in the range $1\times10^{17}$-$5\times10^{18}$ cm$^{-3}$ and the doping level of the second part 122 is in the range $5\times10^{15}$-$1\times10^{17}$ cm$^{-3}$.

The first part 120 of the doped region in this embodiment also has a larger vertical dimension than the second part 122 of the doped region. As can be seen in FIG. 3, the larger vertical dimension of the first part 120 of the doped region means that the first part 120 extends upwardly closer to the collector-base junction than would be the case if the first part 120 of the doped region had the same vertical dimension as the second part 122 of the doped region. The greater vertical dimension of the first part 120 of the first part 120 of the doped region may be the result of an outdiffusion process during manufacture. For instance, during an annealing step, for activating the dopants in the device 10, the more densely doped part 120 may diffuse out to a greater spatial extent owing to its higher doping density than the dopants of the second part 122 of the doped region.

In this embodiment, the underlying region 28 of the substrate of the device 10 has a generally lower doping profile than any part of the doped region, including either the first part 120 and the second part 122 of the doped region.

The underlying substrate region 28 has the same conductivity type as the doped region. Therefore, in the present embodiment is p-type.

The non-uniform doping profile of the bipolar transistor allows for further optimisation of the field shaping within the collector 2 of the device in a number of ways.

For instance, as has been noted above, it may generally be desirable that a doped region located beneath a collector for field shaping within the collector has a relatively high doping level at a position closest to the collector-based junction to increase the strength of the field shaping in that vicinity. By providing a non-uniform doping profile for the doped region in the embodiment of FIG. 3, an increased doping level at a position closest to the collector-based junction can be achieved without necessarily increasing the doping level of the doped region in other parts of the device. For instance, the doping level of the second part 122 of the doped region can remain relatively low compared to the doping level of the first part 120. This can alleviate the above-noted issue relating to device breakdown associated with collector-substrate currents flowing close to the sinker 32. Additionally, because the second part 122 of the doped region beneath the laterally extending drift region of the collector 2 can remain relatively lowly doped, the above-noted issue relating to increased collector resistance $R_C$ associated with outdiffusion of dopants into the laterally extending drift region may be mitigated. Accordingly, a device in accordance with an embodiment of this invention may not necessarily suffer from issues relating to collector-substrate breakdown currents and/or an increase in collector resistance leading to a low $f_T$ for the device.

Still a further possible advantage of the non-uniform doping profile of the dope region as noted in FIG. 3 is that design freedom relating to the sinker 32 may be increased. This is again due to the fact that the second part 122 of the doped region may be relatively lightly doped. High doping levels within this part of the doped region may lead to avalanche breakdown near the sinker 32 associated with impact ionisation of charge carriers at high operating voltages. Because the second part 122 of the doped region may be relatively lightly doped, the effect of impact ionisation near the sinker 32 is lessened. Consequently, the sinker 32 may itself be more highly doped and/or may extend deeper into the collector 2. In either case, the collector resistance may be decreased.

The non-uniform doping profile of the doped region can be formed during manufacture using, for example, ion implantation techniques. For instance, in one example, a substantially uniformly doped part of the doped region, corresponding to the second part 122, can be implanted and then a mask can be used to implant further dopants specifically at the location of the first part 120 of the doped region. Thereafter, an anneal process can be used to activate the dopants. A certain degree of outdiffusion can take place during the anneal as explained above. As also noted above, the annealing process may cause the more highly doped first part 120 of the doped region to diffuse out to a greater spatial extent than the relatively lowly doped part 122 of the doped region.

Figure 4:
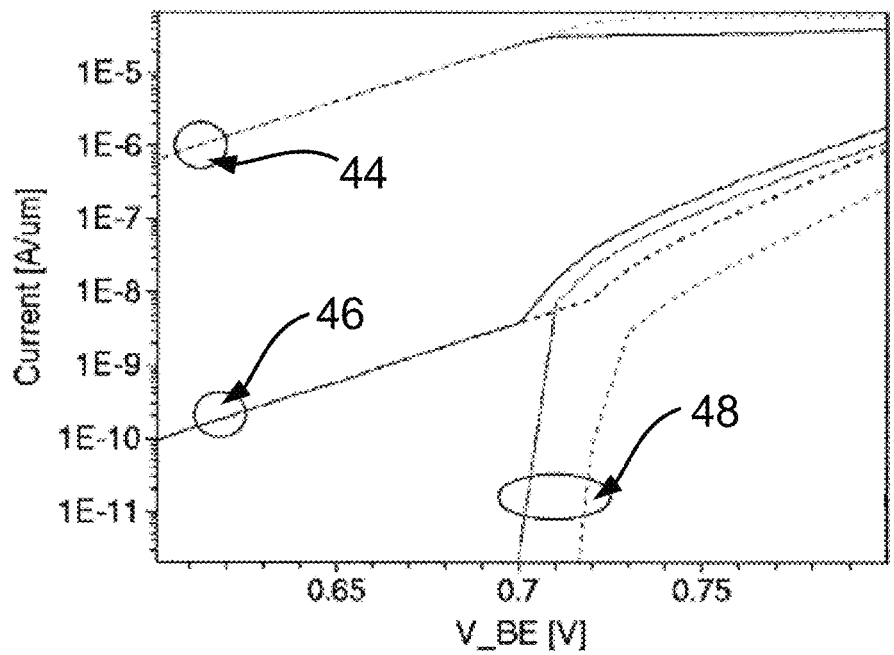
FIG. 4 compares the collector, base and substrate currents of a bipolar transistor of the kind shown in FIG. 3 with those of a bipolar transistor of the kind shown in FIG. 1.

FIG. 4 shows the results of simulations that calculate the currents in various parts of a bipolar transistor of the kind described above in relation to FIG. 3 with those in a transistor of the kind described in relation to FIG. 1. The dotted lines in FIG. 4 correspond to a device having a non-uniform doped region as explained in relation to FIG. 3, whereas the solid lines relate to a device of the kind shown in FIG. 1, which has a doped region having a uniform doping profile. Plots 44 in FIG. 4 correspond to the collector current. Plots 46 in FIG. 4 correspond to the base currents. Plots 48 in FIG. 4 correspond to the current going into the substrate.

In FIG. 4, we see that the device with a non-uniform collector has a much lower collector resistance, which indicates a lower substrate current (and the onset of substrate current happens at larger $V_{BE}$).

Figure 5:
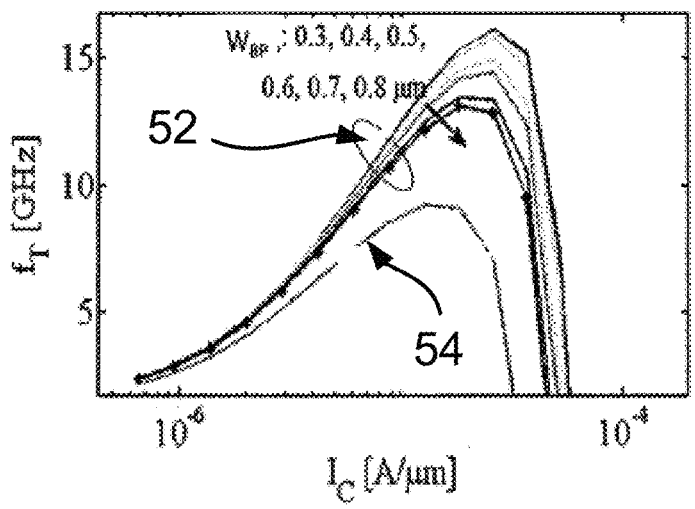
FIG. 5 demonstrates the effect on $f_T$ of varying the lateral width of the highly doped part of the doped region closest to a collector-base junction.

FIG. 5 shows the results of simulations modelling the cut off frequency $f_T$ of a device according to an embodiment of this invention, for a variety of different non-uniform doping profiles for the doped region. In particular, FIG. 5 simulates $f_T$ as a function of collector current for a variety of lateral widths ($W_{BP}$) of the first part 120 of the doped region (plots 52) and compares them with $f_T$ for a device of the kind described above in relation to FIG. 1 (plot 54). As can be seen in FIG. 5, as the lateral dimension of the first part 120 of the doped region becomes greater, the line shape for $f_T$ as a function of collector current changes and moves towards the line shape of a device that has a uniform doped region. From this, it can be seen that, in general, when the first part 120 of the doped region is more tightly focused in a smaller space, $f_T$ is generally higher for a given collector current.

Table 1 below shows calculated values of the breakdown voltages $BV_{CEO}$ and $BV_{CBO}$ for each value of $W_{BP}$ in the graph of FIG. 5. It is clear that $BV_{CEO}$ and $BV_{CBO}$ may be significantly higher where a doped region having a non-uniform doping profile is provided.

TABLE 1

Simulated breakdown voltages as a function of width ($W_{BP}$) of the part of doped region closest to the collector-base junction.

| Breakdown voltage | Uniformly doped region | Non-uniform doping profile: lateral width of first part 120 (μm) | | | | | |
|---|---|---|---|---|---|---|---|
| | | 0.3 | 0.4 | 0.5 | 0.6 | 0.7 | 0.8 |
| $BV_{CEO}$ (V) | 12 | 16 | 17 | 18 | 18 | 18 | 19 |
| $BV_{CBO}$ (V) | 26 | 32 | 32 | 32 | 32 | 32 | 32 |
| $f_T$ (GHz) | 7 | 16 | 16 | 15 | 14.5 | 13.4 | 13 |

In addition to the above described simulations, measurements on fabricated devices having a non-uniform doping profile for the doped region have been conducted. These measurements have confirmed that the provision of a non-uniform doping profile in the doped region allows the device to have a higher $BV_{CEO}$, a lower substrate current and a higher $f_T$. The results of these measurements are shown in FIGS. 6 and 7.

Figure 6:
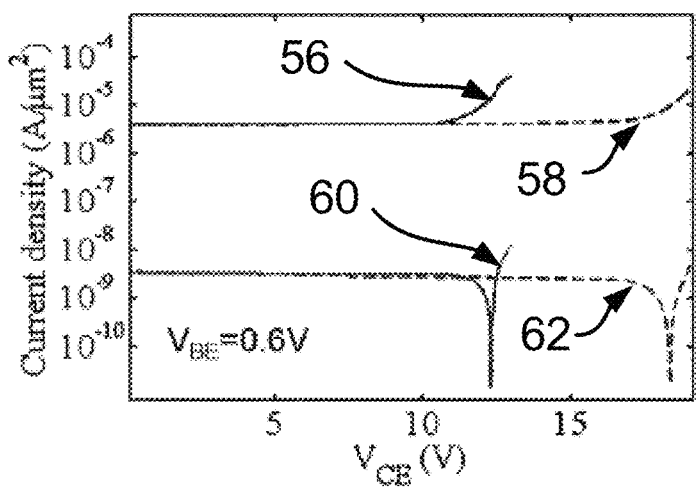
FIG. 6 compares the breakdown voltage $BV_{CEO}$ of a bipolar transistor of the kind shown in FIG. 3 with the those of a bipolar transistor of the kind shown in FIG. 1.

In FIG. 6, current density as a function of $V_{CE}$ is plotted for the collector currents and base currents in devices of the kind shown in FIGS. 1 and 3. Thus, plot 56 in FIG. 6 relates to the collector current of a device having a doped region with a uniform doping profile while the plot 58 corresponds to the collector current in a device having a non-uniform doping profile.

The plot 60 corresponds to the base current of a device having a uniform doping profile while the plot 62 corresponds to the base current of a device having a non-uniform doping profile. The measurements were made at $V_{BE}=0.6V$. It is clear in FIG. 6 that the $BV_{CEO}$ is higher in the device having a non-uniform doping profile.

Figure 7:
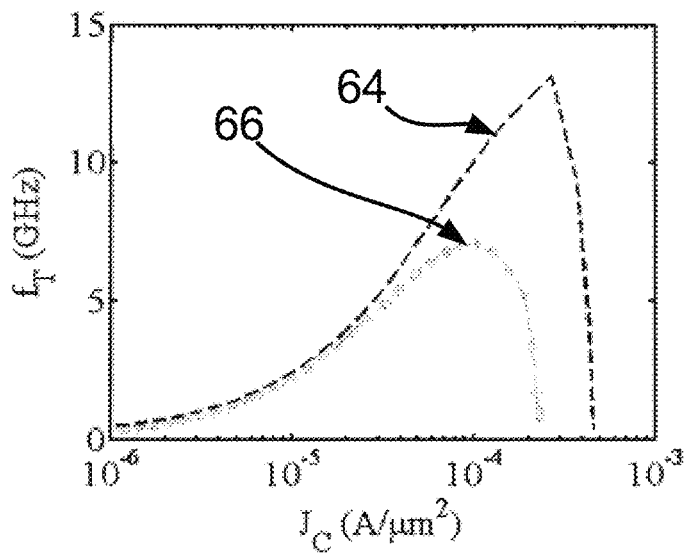
FIG. 7 compares the cut-off frequency $f_T$ of a bipolar transistor of the kind shown in FIG. 3 with the those of a bipolar transistor of the kind shown in FIG. 1.

In FIG. 7, cut-off frequency $f_T$ is plotted as a function of current density in the collector of a device having a doped region with a uniform doping profile (plot 66) and of a device having a doped region with a non-uniform doping profile (plot 64). Clearly, $f_T$ for a device having a doped region having a non-uniform doping profile is substantially higher than for a device having a doped region with a uniform doping profile. Moreover, the current at the peak in $f_T$ is higher in the case of a device having a doped region with a non-uniform doping profile, which is beneficial for power performance.

In a device of the kind described above in relation to FIG. 3 it may in some cases be beneficial to reduce the lateral length $L_D$ of the laterally extending drift region of the collector 2. In particular, this can allow higher values of $f_T$ to be reached. For instance, it has been found that for values of $L_D$ greater than about 0.6 µm (depending on the doping levels within the device) the higher collected transit times and increased collective resistance $R_C$ can decrease $f_T$. One way to reduce the lateral width of the laterally extending drift region is to bring the collector contact 22 of the device 10 closer to the emitter region. Examples of this are illustrated in FIGS. 8A and 8B.

Figure 8A:
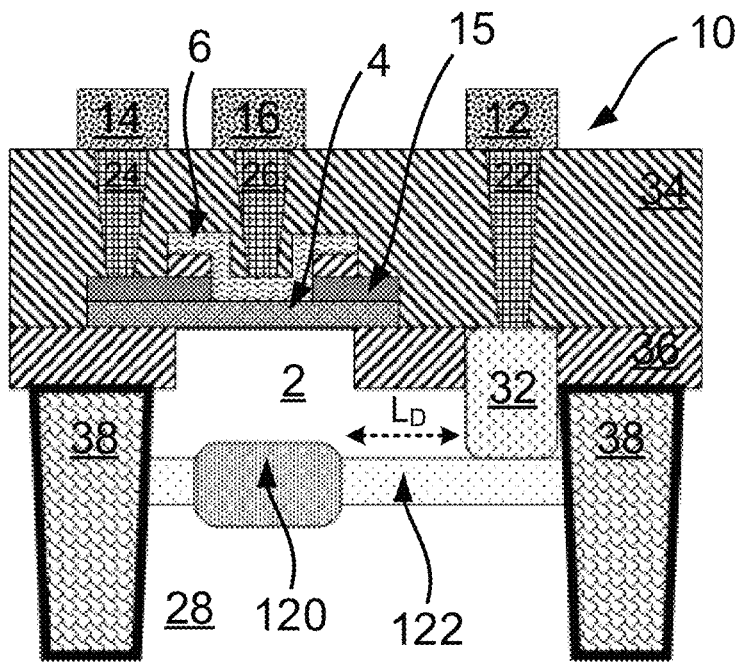
FIGS. 8A and 8B each show a bipolar transistor in accordance with an embodiment of the invention.

In the embodiment of FIG. 8A, it can be seen that the lateral dimension $L_D$ of the laterally extending draft region is substantially smaller than that shown in, for example, FIG. 3. However, a consequence of this may be that the amount of room available above the laterally extending drift region for other components of the device becomes limited. For instance, it may not be possible to provide base contact(s) above the laterally extending drift region, between the collector contact(s) 22 and the emitter contact(s) 26 as is provided in the example of FIG. 3. In FIG. 8A, base contact(s) 24 are nevertheless provided on the opposite side of the emitter contact 26. The provision of fewer base contacts in FIG. 8A (since they are provided only one side of the emitter contact(s) 26) may lead to greater base resistance.

Figure 8B:
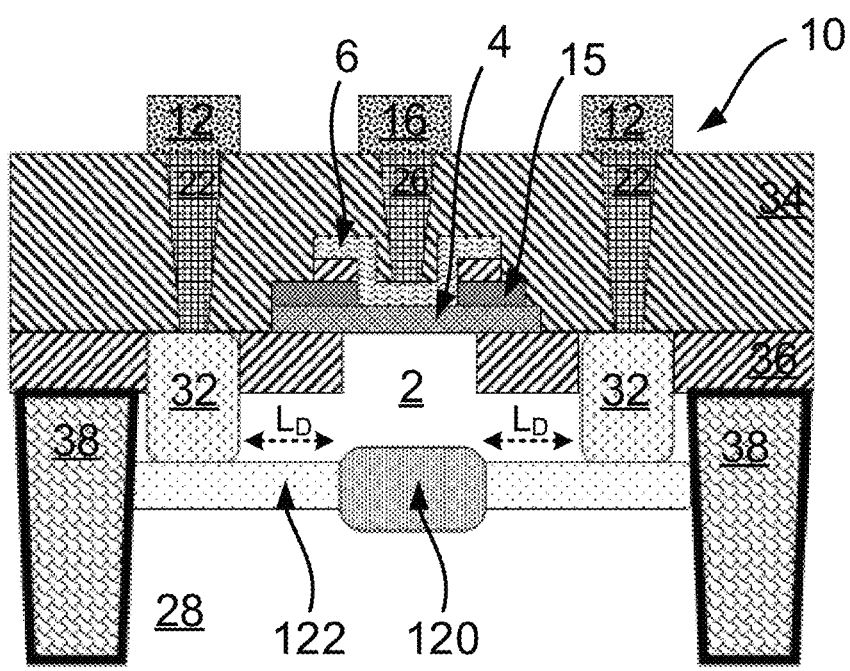
Figure 9:
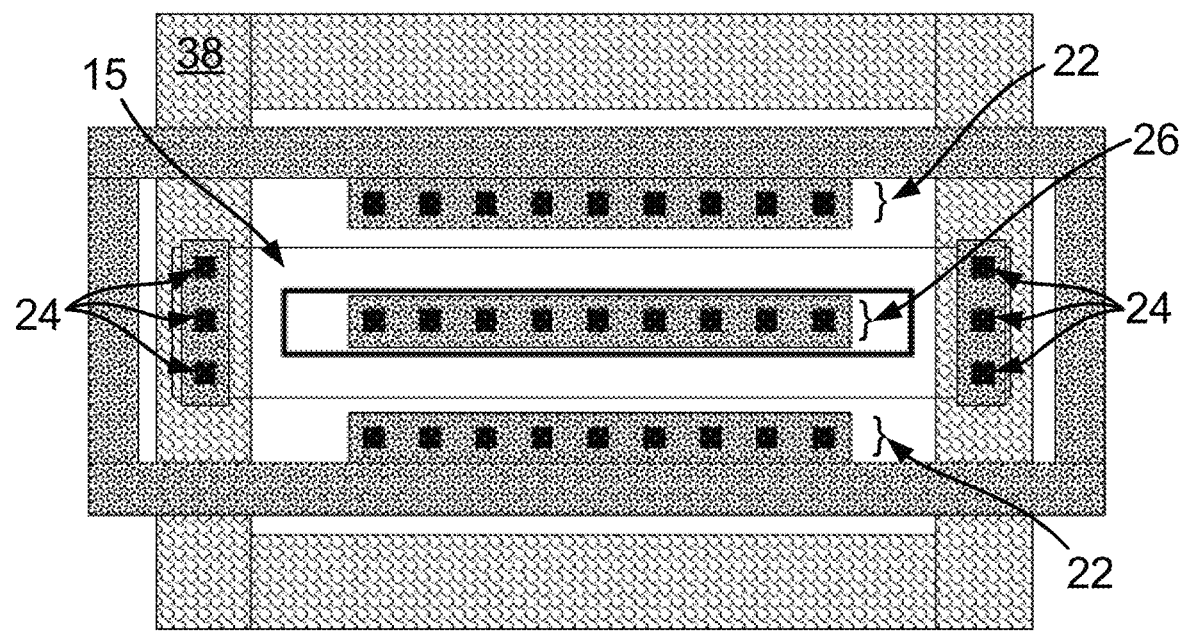
FIG. 9 shows a top view of the embodiment of FIG. 8B.

Moreover, as shown in FIG. 8B, in a symmetrical device in which the collector 2 includes a laterally extending drift region that extends in either a direction away from the emitter/base/collector stack, shortening of the lateral dimension $L_D$ may completely remove any space otherwise available for the provision of base contact(s). As shown in FIG. 9 (which shows the layout of the device 10 as viewed from above the substrate), a device of the kind shown in FIG. 8B may nevertheless be provided with base contacts 24 that are located at the side of the device 10, instead of in between the emitter contact(s) 26 and collector contact(s) 22. Nevertheless, the relatively small extrinsic base connection 15 (e.g. comprising polysilicon) in FIG. 9 that is required to implement this layout can still lead to a relatively high base resistance and therefore a relatively low $f_{MAX}$.

Figure 10:
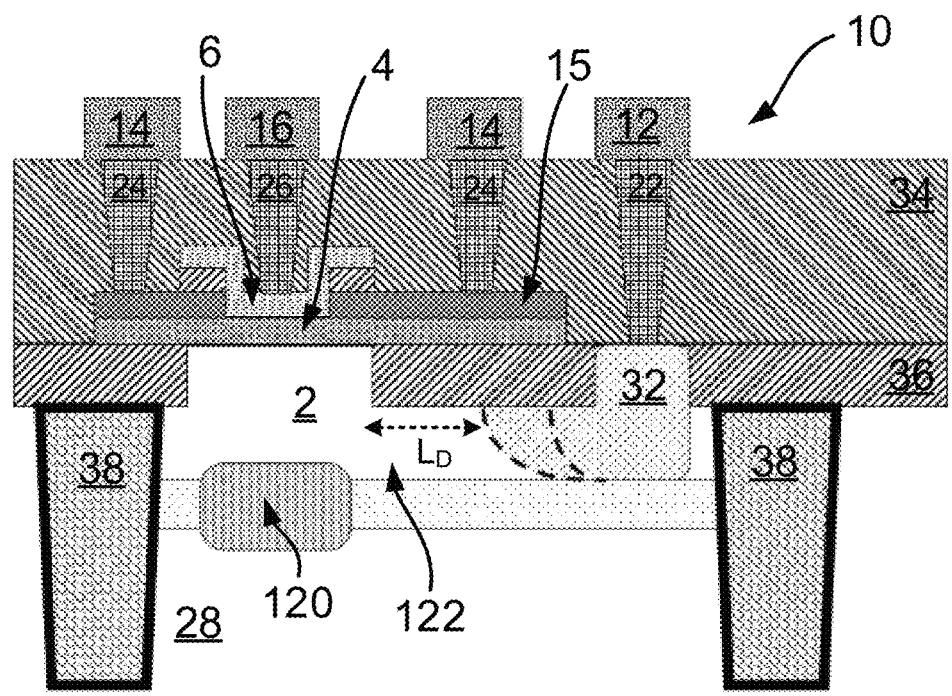
FIG. 10 shows a bipolar transistor in accordance with an embodiment of the invention.
Figure 11:
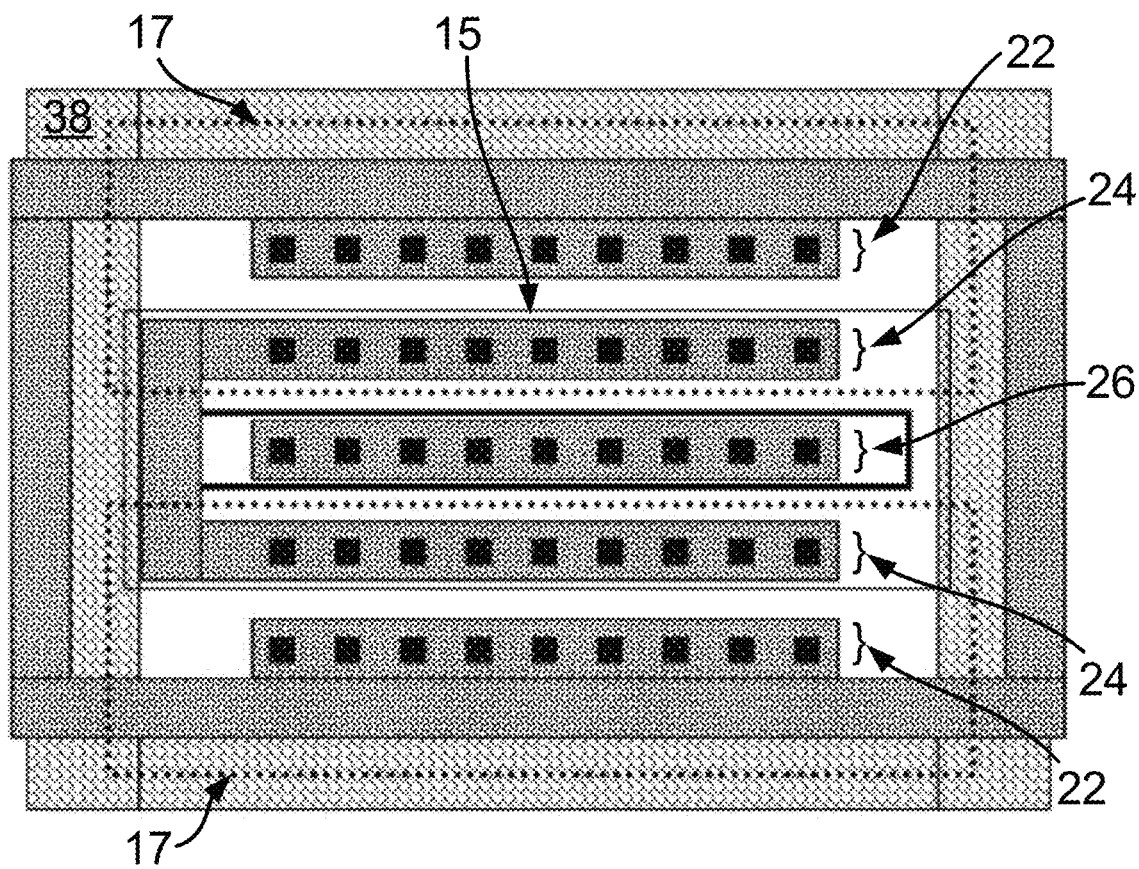
FIG. 11 shows a top view of the embodiment of FIG. 10.

FIG. 10 illustrates a semiconductor device comprising a bipolar transistor according to another embodiment of the invention. The layout of the device 10 of FIG. 10, as viewed from above the substrate is shown in FIG. 11.

The device in FIG. 10 is similar in many respects to the device described above in relation to FIG. 3. The main difference between the device in FIG. 10 and the device in FIG. 3 is that in FIG. 10 the sinker 32 extends downwardly into the collector 2 and also extends laterally, beneath the isolation region 36 in a direction towards the collector-base junction. This has the effect that the lateral dimension $L_D$ of the laterally extending drift region of the collector 2 is reduced.

A benefit of this is that as noted above, collector transit times can be reduced, as can collector resistance $R_C$. The extent to which the sinker 32 extends laterally beneath the isolation region 36 towards the collector-base junction can be chosen according to the required breakdown voltage (and resulting dimension $L_D$). Note that unlike the examples shown in FIGS. 8A and 8B, the effective dimension of the laterally extending drift region of the collector 2 $L_D$ is reduced while retaining room above the isolation region 36, in between the collector contact(s) 22 and emitter contact(s) 26 for one or more base contact(s) 24.

Accordingly, embodiments of this invention can allow the effective length $L_D$ of the laterally extending drift region of the collector 2 to be reduced in a manner that does not impinge upon the layout of the device 10. For instance, base contact(s) 24 may retain their position between the emitter contact(s) 26 and the collector contact(s) 22. Because the base contact(s) 24 may retain their position, the reduced effective drift length of the laterally extending collector may be implemented in a manner that need not lead to an increase in base resistance.

Referring to FIG. 11, a relatively large extrinsic base connection 15 is used and the base contact(s) 24 are located in between the collector contact(s) 22 and emitter contact(s) 26. In FIG. 11, the reference symbol 17 refers to the outline of a deep N-well mask that can be used in order to implement the laterally extending sinker 32 using an ion implantation process.

In particular, the mask can allow ions to be implanted through the isolation region 36 during manufacture, to reach the underlying collector 2. Following a subsequent anneal step to activate the dopants, the resulting sinker 32 may extend laterally to some extent beneath the isolation region 36, thereby to limit the effective lateral dimension of the drift region of the collector 2.

Figure 12:
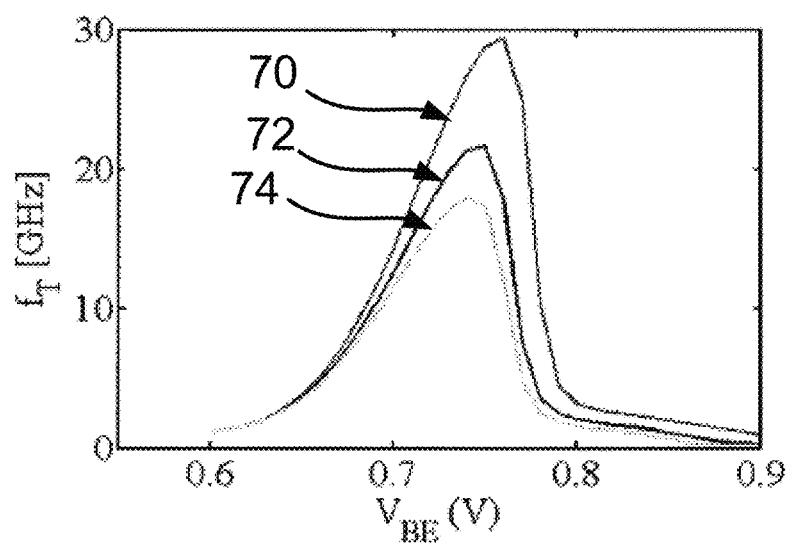
FIG. 12 demonstrates the effect on $f_T$ of varying the effective lateral length of the drift region of a collector of a bipolar transistor of the kind shown in FIGS. 10 and 11.

FIG. 12 shows the results of simulations of $f_T$ as a function of the $V_{BE}$ for various effective drift lengths $L_D$ and sinker lateral dimension $L_{sinker}$, which are summarised below in Table 2.

TABLE 2

Effective Drift Lengths and Sinker Lateral Dimensions in FIG. 12.

| Plot in FIG. 12 | Effective Drift Length ($L_D$) | Sinker Lateral Dimension ($L_{sinker}$) |
|---|---|---|
| 70 | 0.8 µm | 1.5 µm |
| 72 | 1.0 µm | 1.3 µm |
| 74 | 1.2 µm | 1.1 µm |

As can be seen in FIG. 12, the reduction in $L_D$ can lead to a generally higher value of $f_T$. The lateral dimension of the sinker 32 can be adjusted by adjusting the dimension of the deep N-well mask 17 shown in FIG. 11.

Accordingly, there has been described a semiconductor device comprising a bipolar transistor and a method of making the same. A power amplifier including a bipolar transistor. The bipolar transistor includes a collector including a laterally extending drift region. The bipolar transistor also includes a base located above the collector. The bipolar transistor further includes an emitter located above the base. The bipolar transistor also includes a doped region having a conductivity type that is different to that of the collector. The doped region extends laterally beneath the collector to form a junction at a region of contact between the doped region and the collector. The doped region has a non-uniform lateral doping profile. A doping level of the doped region is highest in a part of the doped region closest to a collector-base junction of the bipolar transistor.

Although particular embodiments of the invention have been described, it will be appreciated that many modifications/additions and/or substitutions may be made within the scope of the claimed invention.

The invention claimed is:

1. A semiconductor device comprising a bipolar transistor, the bipolar transistor comprising:
    a collector including a laterally extending drift region;
    a base located above the collector;
    an emitter located above the base; and
    a doped region having a conductivity type that is different to that of the collector, the doped region extending laterally beneath the collector to form a junction at a region of contact between the doped region and the collector,
    wherein the doped region has a non-uniform lateral doping profile, and
    wherein a doping level of the doped region is highest in a part of the doped region closest to a collector-base junction of the bipolar transistor.

2. The semiconductor device of claim 1, wherein the part of the doped region closest to the collector-base junction is located vertically beneath the collector-base junction.

3. The semiconductor device of claim 1, wherein the vertical dimension of the doped region is at its greatest in the part of the doped region closest to the collector-base junction and having the highest doping level.

4. The semiconductor device of claim 3, wherein the part of the doped region closest to the collector-base junction is a part of the doped region that is outdiffused to a greater extent than a remainder of the doped region.

5. The semiconductor device of claim 1 comprising an isolation region located above the laterally extending drift region of the collector.

6. The semiconductor device of claim 5, wherein the collector-base junction is located at an opening in the isolation region, and wherein the vertical dimension of the collector is at its greatest in a part of the collector closest to the opening.

7. The semiconductor device of claim 1 further comprising:
    a collector contact for making electrical contact with an end of the laterally extending drift region of the collector distal the collector-base junction; and
    a sinker extending downwardly from the collector contact into the collector.

8. The semiconductor device of claim 1, further comprising one or more base contacts located vertically above the laterally extending drift region of the collector.

9. The semiconductor device of claim 1 comprising a further doped region beneath the doped region, wherein the further doped region has the same conductivity type as the doped region and wherein the further doped region has a lower doping level than any part of the doped region.

10. The semiconductor device of claim 1 comprising a contact for applying a potential to the doped region.

11. The semiconductor device of claim 1, wherein the bipolar transistor is an npn bipolar transistor in which the conductivity type of the collector and the emitter is n-type and the conductivity type of the base is p-type.

12. A power amplifier comprising the semiconductor device of claim 1.

13. A method of manufacturing semiconductor device comprising a bipolar transistor, the method comprising:
    forming a collector including a laterally extending drift region;
    forming a base located above the collector;
    forming an emitter located above the base; and
    forming a doped region having a conductivity type that is different to that of the collector, the doped region extending laterally beneath the collector to form a junction at a region of contact between the doped region and the collector,
    wherein the doped region has a non-uniform lateral doping profile, and
    wherein a doping level of the doped region is highest in a part of the doped region closest to a collector-base junction of the bipolar transistor.

14. The method of claim 13, wherein forming the doped region further comprises a heating step in which the part of the doped region closest to a collector-base junction diffuses out to a greater spatial extent than any other part of the doped region.

* * * * *